United States Patent
Lozano

(10) Patent No.: US 8,761,675 B2
(45) Date of Patent: Jun. 24, 2014

(54) WIRELESS FUNCTION STATE SYNCHRONIZATION

(75) Inventor: Raul Lozano, Espoo (FI)

(73) Assignee: Nokia Corporation, Espoo (FI)

( * ) Notice: Subject to any disclaimer, the term of this patent is extended or adjusted under 35 U.S.C. 154(b) by 348 days.

(21) Appl. No.: 13/289,433

(22) Filed: Nov. 4, 2011

(65) Prior Publication Data

US 2013/0114832 A1    May 9, 2013

(51) Int. Cl.
*H04B 7/00* (2006.01)
*H04M 1/00* (2006.01)

(52) U.S. Cl.
USPC ..................... 455/41.3; 455/569.1

(58) Field of Classification Search
CPC .......... H04M 1/6066; H04M 2250/02; H04M 1/7253; H04M 1/6033; H04M 1/6058; H04R 2420/07; H04B 5/06
USPC ..................... 455/39, 41.1, 41.2, 41.3, 569.1; 381/370, 375
See application file for complete search history.

(56) References Cited

U.S. PATENT DOCUMENTS

| | | | |
|---|---|---|---|
| 2005/0055202 A1* | 3/2005 | Kunito et al. | 704/225 |
| 2007/0258614 A1* | 11/2007 | Langberg | 381/379 |
| 2008/0146290 A1* | 6/2008 | Sreeram et al. | 455/569.1 |
| 2009/0005129 A1* | 1/2009 | McLoone et al. | 455/575.2 |
| 2011/0306393 A1* | 12/2011 | Goldman et al. | 455/575.2 |

OTHER PUBLICATIONS

Hands-Free Profile 1.6; Bluetooth Specification, May 10, 2011; pp. 1-126.

\* cited by examiner

*Primary Examiner* — Nguyen Vo
(74) *Attorney, Agent, or Firm* — Locke Lord LLP

(57) ABSTRACT

A system for facilitating synchronized apparatus interaction. In accordance with at least one embodiment of the present invention, an apparatus may determine if muting of a microphone has been requested. If the apparatus determines that muting has been requested, the apparatus may activate muting of the microphone and may transmit a message comprising information indicating that muting has been activated.

19 Claims, 12 Drawing Sheets

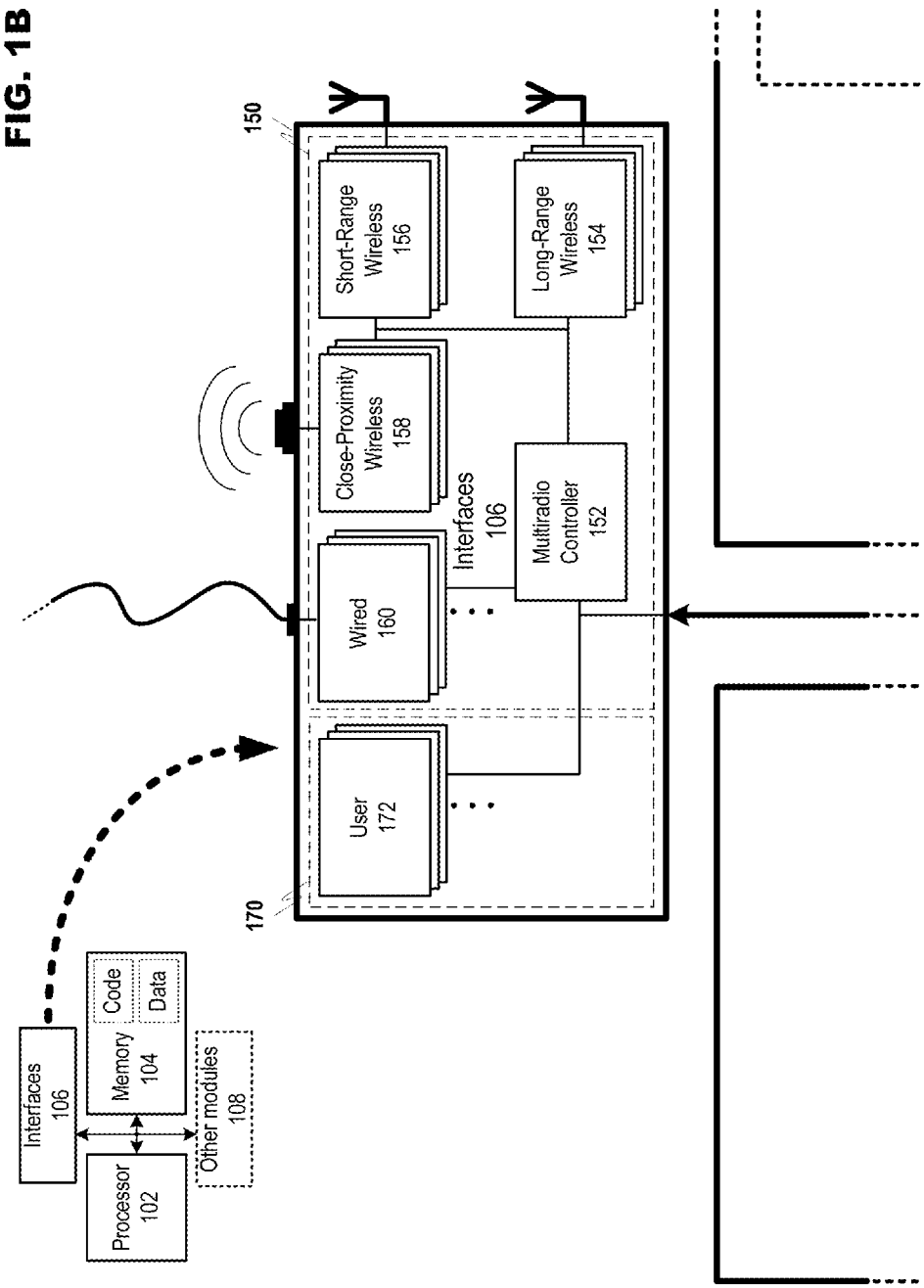

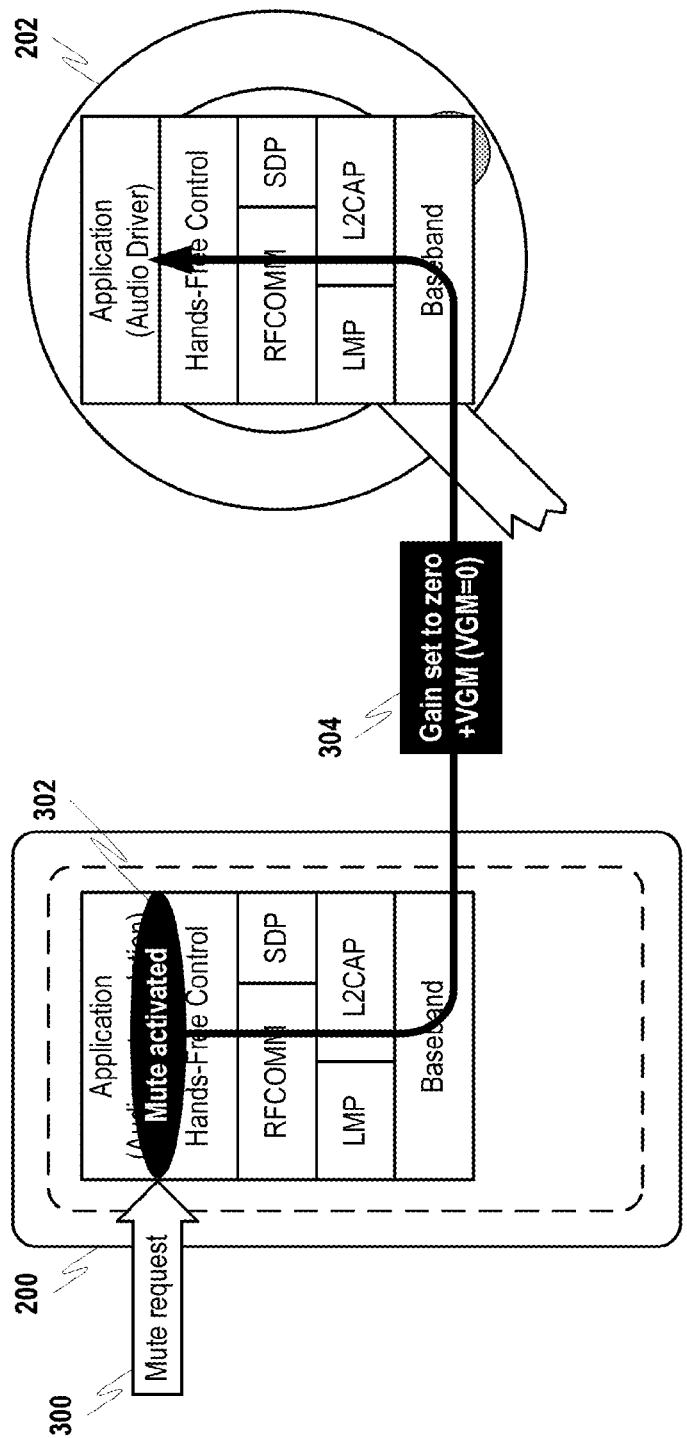

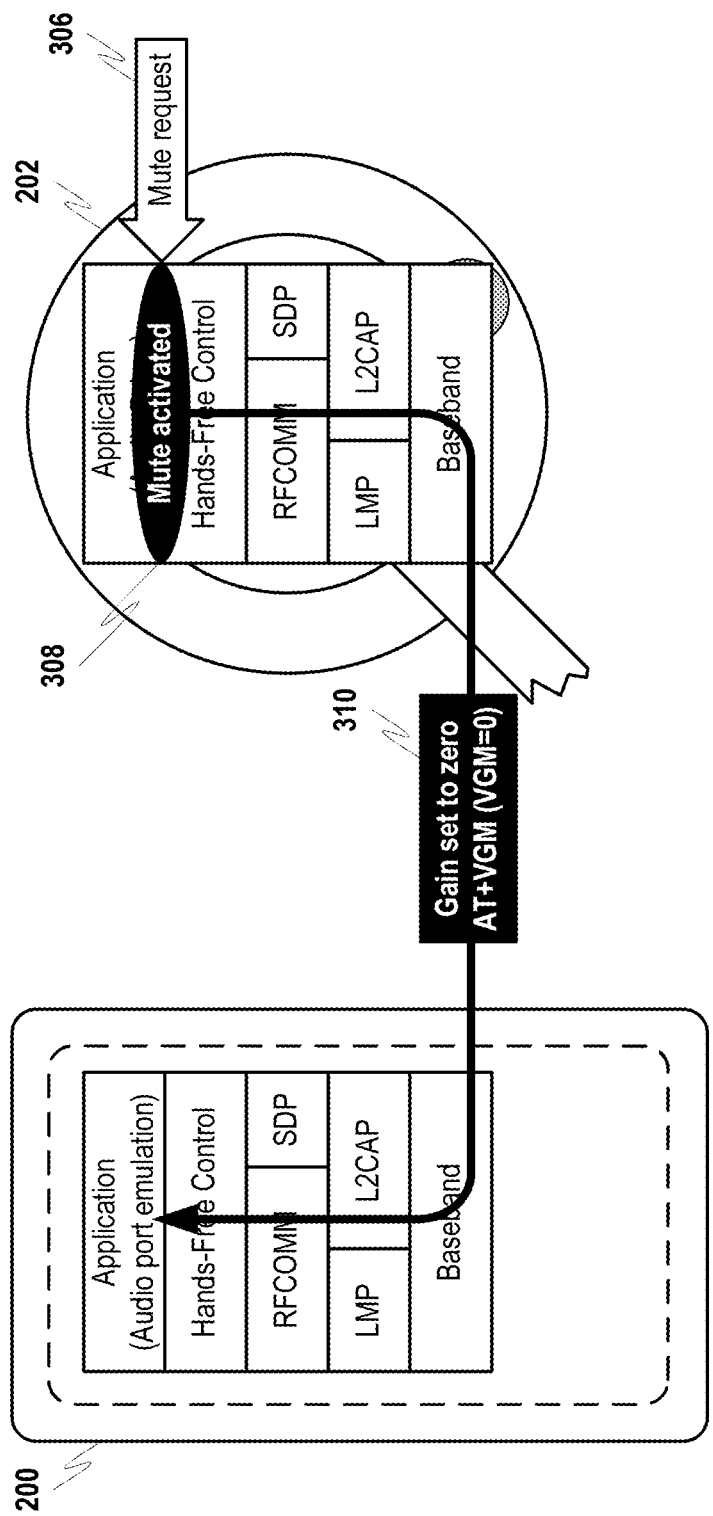

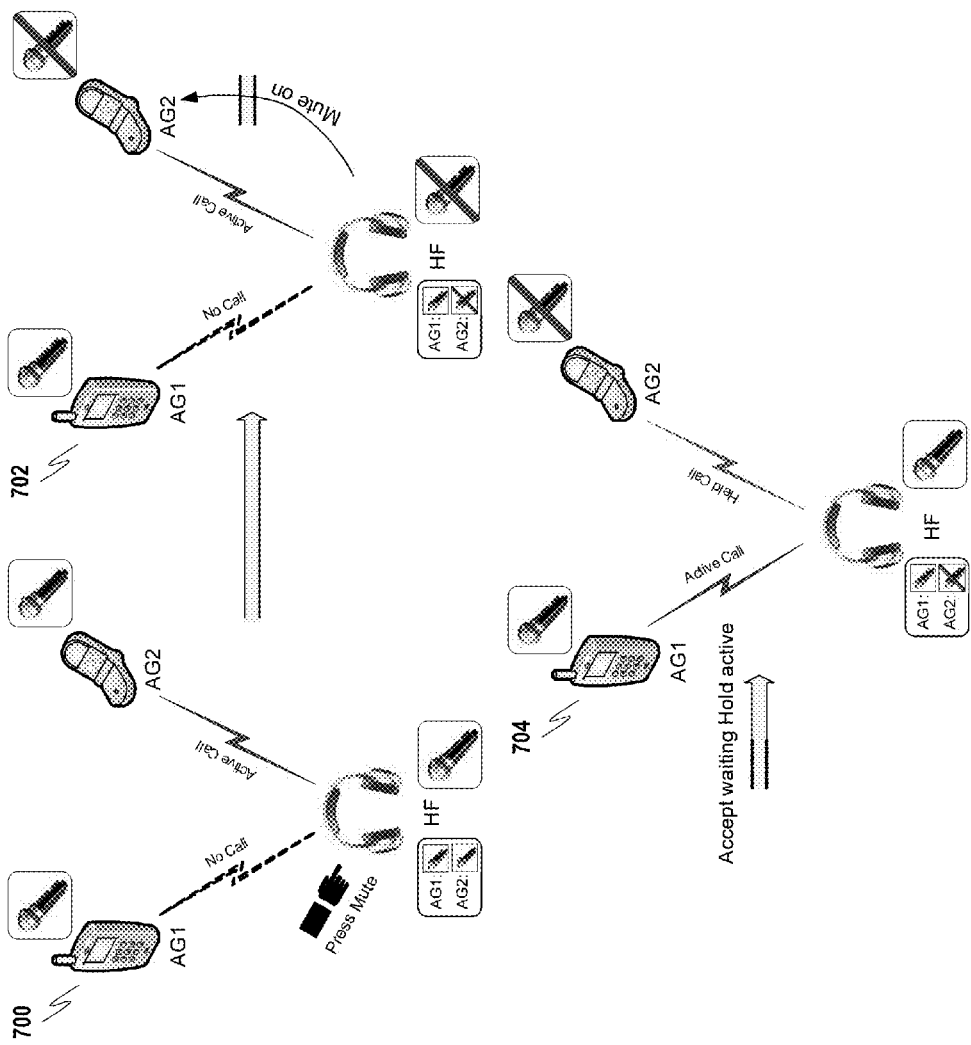

WIRELESS FUNCTION STATE SYNCHRONIZATION

BACKGROUND

1. Field of Invention

Embodiments of the present invention pertain to wireless communication, and in particular, to enabling the wireless conveyance of communal information between apparatuses.

2. Background

Wireless technology has evolved from a simple carrier for voice communication to being employed in various wireless applications. Enhancements in wireless technology have substantially improved communication abilities, quality of service (QoS), speed, etc., which have contributed to insatiable user desire for new device functionality. As a result, portable wireless apparatuses are no longer just relied on for making telephone calls. They have become integral, and in some cases essential, tools for managing the professional and/or personal lives of users.

The emergence of wireless-enabled apparatuses as universal communication tools has brought with it some unexpected consequences. For example, the ability to communicate via voice, text, email, etc. at any time may, in certain circumstances, be viewed as problematic. The use of apparatuses while operating a motor vehicle is at least one scenario wherein the benefit of omnipresent communication access may lead to distraction and serious injury. As a result, some solutions have emerged to allow for operation with reduced distraction. In voice operations the use of wired or wireless headsets may allow users to conduct conversations without interrupting their focus on other tasks, such as operating a motor vehicle, or simply walking down the street.

Wired and wireless headsets not only serve to conduct voice communication, but often include controls for remotely administrating various functionalities associated with voice communication. These controls may, for example, adjust the volume of the headset, adjust the microphone level (e.g., gain) in the headset, or operate certain functionalities in the wireless communication apparatus. In some instances the functionalities available in a headset may be duplicative of functionalities also available in the associated wireless communication apparatus. In such instances a user of various apparatuses (e.g., a headset and associated communication apparatus) must be aware of how these duplicative features have been set in each apparatus.

SUMMARY

Example embodiments of the present invention may be directed to a method, apparatus, computer program and system for facilitating synchronized apparatus interaction. In accordance with at least one embodiment of the present invention, an apparatus may determine if muting of a microphone has been requested. If the apparatus determines that muting has been requested, the apparatus may activate muting of the microphone and may transmit a message comprising information indicating that muting has been activated.

In at least one example implementation, muting may be requested by determining that a mute button has been depressed on the apparatus. The message resulting from determining that muting has been requested in the apparatus may indicate that gain for the microphone has been set to zero in the apparatus. In accordance with at least one embodiment of the present invention, the message may be transmitted via Bluetooth wireless communication. In the case where Bluetooth is employed and the apparatus is a headset, the message may comprise an AT+VGM command (e.g., in accordance with a Hands-Free profile) indicating that (VGM=0). Alternatively, where Bluetooth is employed and the apparatus is a wireless communication device, the message may comprise an +VGM command indicating that (VGM=0).

It may also be possible for the apparatus to determine if unmuting has been requested in the apparatus. In instances when unmuting has been requested in the apparatus, the apparatus may deactivate muting and may transmit a message containing information indicating that muting has been deactivated in the apparatus. The apparatus may further, in accordance with at least one embodiment of the present invention, determine if a message has been received in the apparatus, the received message comprising information indicating that muting has been activated or deactivated in another apparatus. In instances where the apparatus determines that a message has been received comprising at least the above information, the apparatus may activate or deactivate muting in accordance with the information contained in the received message.

The above summarized configurations or operations of various embodiments of the present invention have been provided merely for the sake of explanation, and therefore, are not intended to be limiting. Moreover, inventive elements associated herein with a particular example embodiment of the present invention can be used interchangeably with other example embodiments depending, for example, on the manner in which an embodiment is implemented.

DESCRIPTION OF DRAWINGS

The disclosure will be further understood from the following description of various exemplary embodiments, taken in conjunction with appended drawings, in which:

FIG. 3A discloses an example message that may be transmitted when a function is activated in accordance with at least one embodiment of the present invention.

FIG. 3B discloses an example message transmission that may occur opposite of FIG. 3A in accordance with at least one embodiment of the present invention.

FIG. 7 discloses a fourth example of the message between more than two apparatuses in accordance with at least one embodiment of the present invention.

DESCRIPTION OF EXEMPLARY EMBODIMENTS

While the present invention has been described herein in terms of a multitude of example embodiments, various changes or alterations can be made therein without departing from the spirit and scope of the present invention, as set forth in the appended claims.

I. Example System with which Embodiments of the Present Invention May be Implemented An example of a system that is usable for implementing various embodiments of the present invention is disclosed in FIG. 1A. The system comprises elements that may be included in, or omitted from, configurations depending, for example, on the requirements of a particular application, and therefore, is not intended to limit present invention in any manner.

Figure 1A:
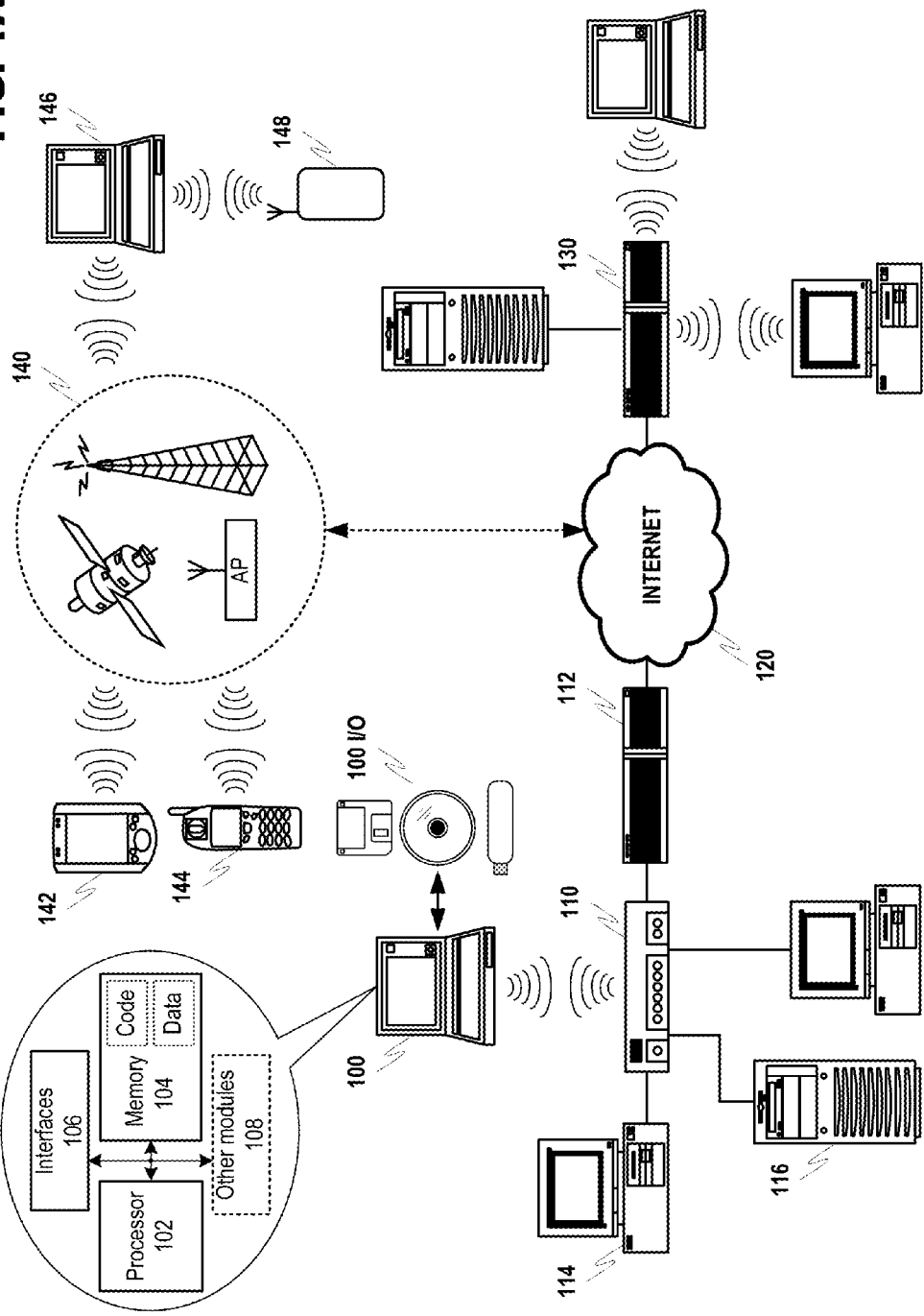
FIG. 1A discloses example apparatuses, systems, configurations, etc. that may be utilized when implementing the various embodiments of the present invention FIG. 1B discloses further detail regarding an example apparatus configuration that may be utilized when implementing the various embodiments of the present invention.

Computing device 100 is represented simply as a laptop computer in FIG. 1A, but may in actuality be any type of computing apparatus comprising at least elements 102-108 (e.g., mobile wireless communicator, cell phone, smartphone, tablet-type computer, etc.) Elements 102-108 correspond to basic categories of subsystems that may support operation in computing device 100. For example, Processor 102 may include one or more devices configured to execute instructions. In at least one scenario, the execution of program code (e.g., groups of computer-executable instructions stored in a memory) by processor 102 may cause computing device 100 to perform processes including, for example, method steps that may result in data, events or other output activities. Processor 102 may be a dedicated (e.g., monolithic) microprocessor device, or may be part of a composite device such as an ASIC, gate array, multi-chip module (MCM), etc.

Processor 102 may be electronically coupled to other functional components in computing device 100 via a wired or wireless bus. For example, processor 102 may access memory 104 in order to obtain stored information (e.g., program code, data, etc.) for use during processing. Memory 104 may generally include removable or imbedded memories (e.g., non-transitory computer readable storage media) that operate in a static or dynamic mode. Further, memory 104 may include read only memories (ROM), random access memories (RAM), and rewritable memories such as Flash, EPROM, etc. Examples of removable storage media based on magnetic, electronic and/or optical technologies are shown at 100 I/O in FIG. 1, and may serve, for instance, as a data input/output means. Code may include any interpreted or compiled computer language including computer-executable instructions. The code and/or data may be used to create software modules such as operating systems, communication utilities, user interfaces, more specialized program modules, etc.

One or more interfaces 106 may also be coupled to various components in computing device 100. These interfaces may allow for inter-apparatus communication (e.g., a software or protocol interface), apparatus-to-apparatus communication (e.g., a wired or wireless communication interface) and even apparatus to user communication (e.g., a user interface). These interfaces allow components within computing device 100, other apparatuses and users to interact with computing device 100. Further, interfaces 106 may communicate machine-readable data, such as electronic, magnetic or optical signals embodied on a computer readable medium, or may translate the actions of users into activity that may be understood by computing device 100 (e.g., typing on a keyboard, speaking into the receiver of a cellular handset, touching an icon on a touch screen device, etc.). Interfaces 106 may further allow processor 102 and/or memory 104 to interact with other modules 108. For example, other modules 108 may comprise one or more components supporting more specialized functionality provided by computing device 100.

Computing device 100 may interact with other apparatuses via various networks as further shown in FIG. 1A. For example, hub 110 may provide wired and/or wireless support to devices such as computer 114 and server 116. Hub 110 may be further coupled to router 112 that allows devices on the local area network (LAN) to interact with devices on a wide area network (WAN, such as Internet 120). In such a scenario, another router 130 may transmit information to, and receive information from, router 112 so that devices on each LAN may communicate. Further, all of the components depicted in this example configuration are not necessary for implementation of the present invention. For example, in the LAN serviced by router 130 no additional hub is needed since this functionality may be supported by the router.

Further, interaction with remote devices may be supported by various providers of short and long range wireless communication 140. These providers may use, for example, long range terrestrial-based cellular systems and satellite communication, and/or short-range wireless access points in order to provide a wireless connection to Internet 120. For example, personal digital assistant (PDA) 142 and cellular handset 144 may communicate with computing device 100 via an Internet connection provided by a provider of wireless communication 140. Similar functionality may be included in devices, such as laptop computer 146, in the form of hardware and/or software resources configured to allow short and/or long range wireless communication. Further, some or all of the disclosed apparatuses may engage in direct interaction, such as in the short-range wireless interaction shown between laptop 146 and wireless-enabled apparatus 148. Example wireless enabled apparatuses 148 may range from more complex standalone wireless-enabled devices to peripheral devices for supporting functionality in apparatuses like laptop 146.

Further detail regarding example interface component 106 disclosed with respect to computing device 100 in FIG. 1A is now discussed regarding FIG. 1B. As previously set forth, interfaces 106 may include interfaces both for communicating data to computing apparatus 100 (e.g., as identified at 150) and other types of interfaces 170 including, for example, user interface 172. A representative group of apparatus-level interfaces is disclosed at 150. For example, multiradio controller 152 may manage the interoperation of long range wireless interfaces 154 (e.g., cellular voice and data networks), short-range wireless interfaces 156 (e.g., Bluetooth and WLAN networks), close-proximity wireless interfaces 158 (e.g., for interactions where electronic, magnetic, electromagnetic and optical information scanners interpret machine-readable data), wired interfaces 160 (e.g., Ethernet), etc. The example interfaces shown in FIG. 1B have been presented only for the sake of explanation herein, and thus, are not intended to limit the various embodiments of the present invention to utilization of any particular interface. Embodiments of the present invention may also utilize interfaces that are not specifically identified in FIG. 1B.

Multiradio controller 152 may manage the operation of some or all of interfaces 154-160. For example, multiradio controller 152 may prevent interfaces that could interfere with each other from operating at the same time by allocating specific time periods during which each interface is permitted to operate. Further, multiradio controller 152 may be able to process environmental information, such as sensed interference in the operational environment, to select an interface that will be more resilient to the interference. These multiradio control scenarios are not meant to encompass an exhaustive list of possible control functionality, but are merely given as examples of how multiradio controller 152 may interact with interfaces 154-160 in FIG. 1B.

II. Example Wireless Hands-Free Protocols

Figure 2:
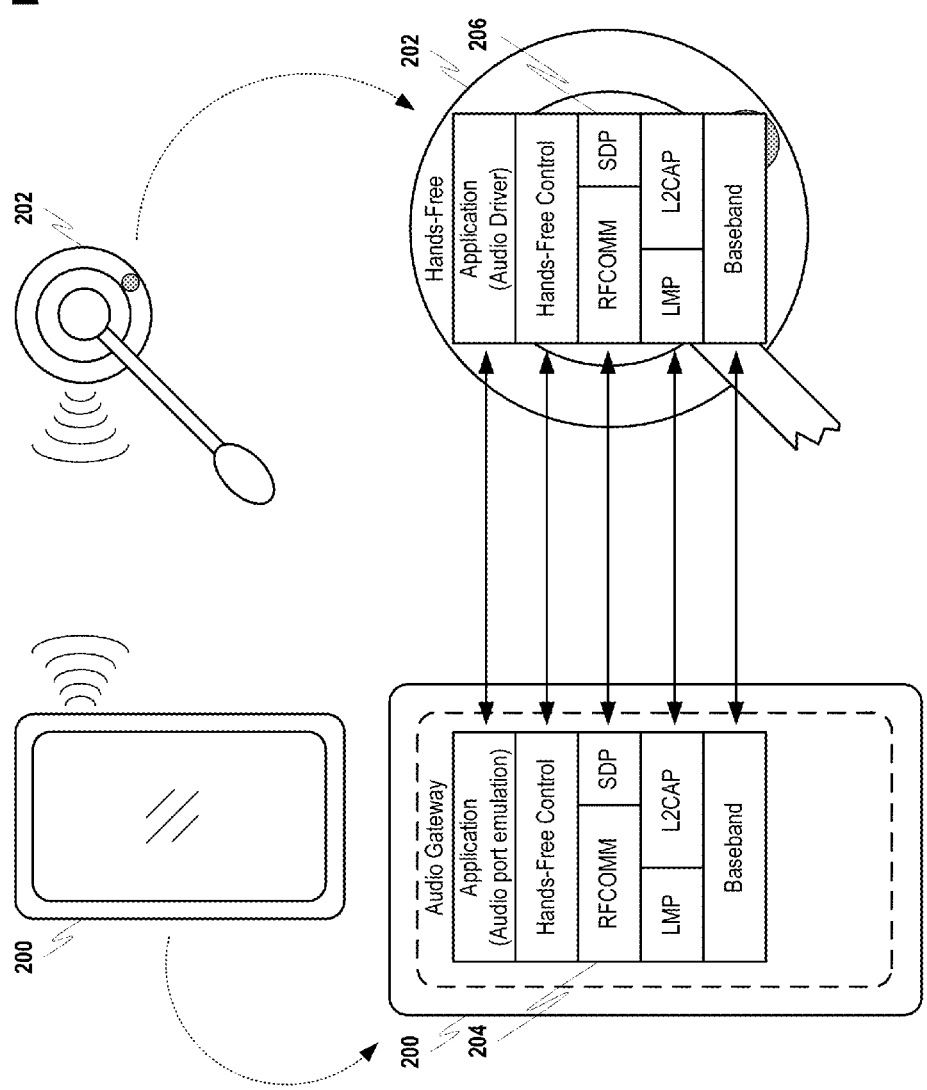
FIG. 2 discloses an example Bluetooth Hand-Free Profile Stack in accordance with at least one embodiment of the present invention.

FIG. 2 discloses an example of wireless communication between two apparatuses. However, as will be seen in a multitude of example implementations disclosed herein (e.g., FIG. 5A-7), the various embodiments of the present invention are not limited to wireless interaction between only two apparatuses. In the example disclosed in FIG. 2, apparatus 200 may be able to transmit and receive information using at least short-range wireless communication, and in some configurations may also comprise more advanced features such as those described with respect to computing device 100 in FIG. 1A-1B. In the example disclosed in FIG. 2, apparatus 200 may use short-range wireless communication when interacting with peripheral device 202, which may also be a device enabled for at least short-range wireless communication like a wireless headset.

In FIG. 2 apparatuses 200 and 202 may communicate wirelessly using Bluetooth wireless interaction. While Bluetooth will be utilized throughout this disclosure for the sake of explanation, the various embodiments of the present invention are not limited to implementation using only Bluetooth. On the contrary, any form of communication with similar characteristics may be employed in accordance with the various embodiments of the present invention. FIG. 2 further discloses example protocol stacks associated with the Bluetooth Hand Free Profile 1.6 (the contents of which are herein incorporated by reference in their entirety). Audio Gateway protocol stack 204 may operate on apparatus 200 (e.g., the apparatus to be controlled remotely) while hands free protocol stack 206 may operate on headset 202. The Baseband, LMP and L2CAP are the OSI layer 1 and 2 Bluetooth protocols. RFCOMM is the Bluetooth serial port emulation entity. SDP is the Bluetooth Service Discovery Protocol. Compatibility to v1.1 or later Core Specification is required. Hands-Free control in protocol stacks 204 and 206 is the entity responsible for Hands-Free unit specific control signaling; this signaling is AT command based. Although not explicitly disclosed in FIG. 2, it may be assumed by this profile that Hands-Free Control has access to some lower layer procedures (for example, Synchronous Connection establishment). The audio port emulation layer shown in FIG. 2 is the entity emulating the audio port on the Audio Gateway, and the audio driver is the driver software in the Hands-Free unit. For the RFCOMM, SDP, LMP, L2CAP and Baseband protocols/entities, the Serial Port Profile is used as the base standard. For these protocols, all mandatory requirements stated in the Serial Port Profile apply except in those cases where this specification explicitly states deviations.

III. Example Hands-Free Operation

When apparatus 200 (e.g., a wireless communication device) and apparatus 202 (e.g., a headset) are connected as shown in FIG. 2, and there is already ongoing communications, users sometimes want to mute the microphone (e.g., to avoid introducing disruptive background noise). However, existing specifications do not define how to achieve it, and currently users can mute the microphone in both the headset and wireless communication device separately, which may create confusion. One way to synchronize operation between multiple apparatuses is to indicate that gain for a microphone in an apparatus has been set to zero to other apparatuses.

In accordance with at least one embodiment of the present invention, the Hands-Free Protocol (HFP) specification may be utilized to synchronize the microphone mute without the need of implementing proprietary protocols. The HFP specification defines commands that may be employed in synchronizing the microphone gain (e.g., +VGM and AT+VGM) in a range of 0 to 15 (16 levels). If a (+VGM) or an (AT+VGM) value of 0 indicates that a microphone is muted, and any other value indicates that a microphone is unmuted, apparatuses 200 and 202 may utilize the aforementioned example HFP commands for maintaining synchronization between microphone levels during normal operation through HFP wireless protocol messaging.

An example of how operation may be synchronized is disclosed in FIG. 3A-3B. Muting for a microphone in apparatus 200 may be requested (e.g., a mute button on apparatus 200 may be depressed) as shown at 300. In response to a determination that muting has been requested in apparatus 200, muting may be activated, as shown at 302, and message 304 may be transmitted including information indicating that gain for the microphone in apparatus 200 has been set to zero. In at least one particular implementation, a message 304 (e.g., comprising at least a +VGM command) may be transmitted, the +VGM command indicating that VGM has been set to 0. The +VGM command may be received by apparatus 202, which may then set its microphone VGM to 0, effectively muting its microphone and synchronizing its operation with the microphone in apparatus 200. Another example, in accordance with at least one embodiment of the present invention, is shown in FIG. 3B wherein a similar message 310 indicating that gain for the microphone in apparatus 202 has been set to zero (e.g., comprising at least an AT+VGM command) may be transmitted from apparatus 202 to apparatus 200. In particular, muting of a microphone in apparatus 202 may be requested at 306 (e.g., via button press), which may then cause muting to activated at 308, and which may trigger apparatus 202 to generate AT+VGM command 310. AT+VGM command 310 may indicate that VGM has been set to 0 for the microphone in apparatus 202, and likewise, apparatus 200 may also set VGM to 0, based on the contents of command 310, to synchronize operation with apparatus 202.

Figure 4:
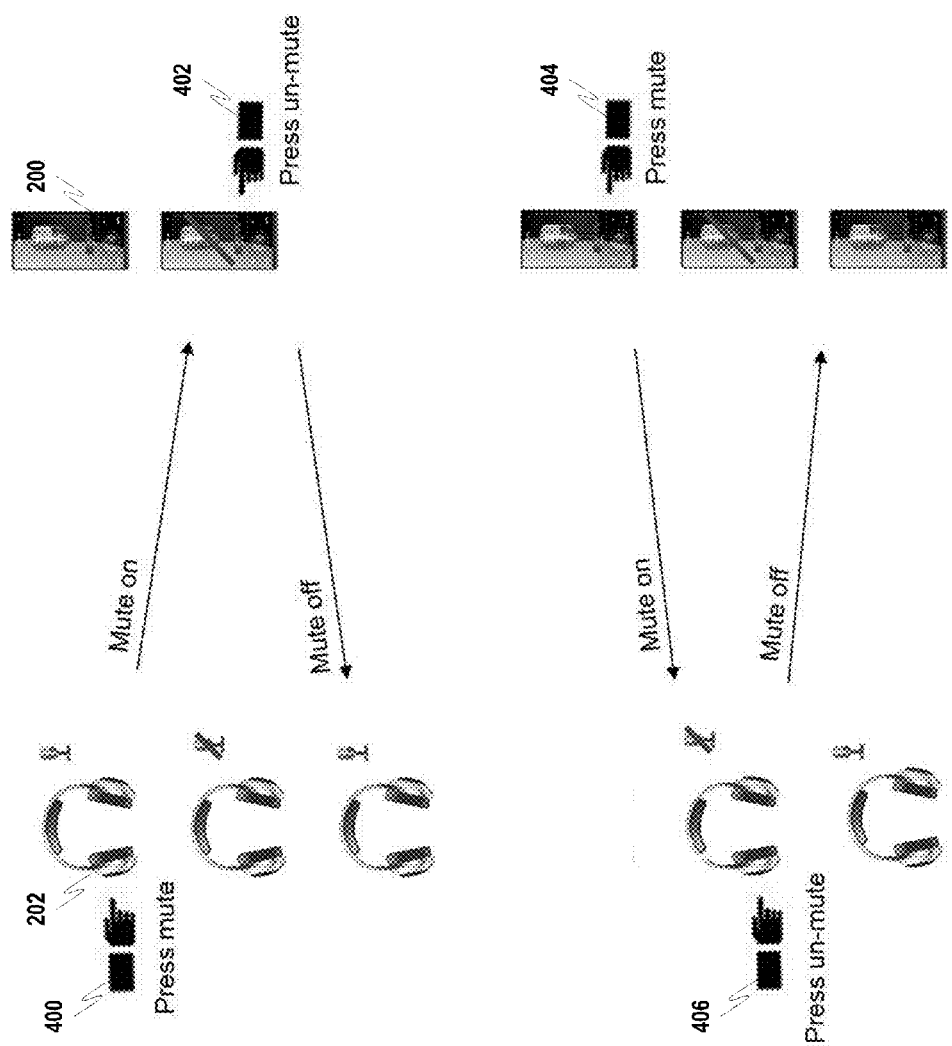
FIG. 4 discloses example message activity that may occur in accordance with at least one embodiment of the present invention.

In at least one example implementation, a user may select either the mute button on apparatus 200 or 202 whenever the microphone is to be muted during a call. In that moment, the apparatus at which mute has been activated may send "Mute On" (VGM=0) command to the other apparatus to maintain synchronization of the apparatuses. Both apparatuses may display a corresponding indication that the apparatus has been muted, for example, on a screen, via LEDs, etc. Then, if the user unmutes the call, the device on which mute is deactivated may transmit a "Mute Off" command (VGM=x, wherein "x" is a value other than 0) to the other apparatus, and both apparatus will indicate that mute is no longer activated. Example behavior is disclosed in FIG. 4. At 400 mute may be activated in apparatus 202, and in apparatus 200 mute may then be activated. At 402 mute may be pressed on apparatus 200 (e.g., to deactivate the mute function) and a command may be sent to apparatus 200 to deactivate the mute function. Similarly, at 404 the mute function may be activated in apparatus 200, which may be replicated in apparatus 202 after receipt of the mute on message, and at 406 mute may be deactivated in both apparatuses as the result of a single button press in apparatus 202 and the subsequent command transmission.

Furthermore, a headset can be coupled to more than one wireless communication device at the same time, handling simultaneous calls from multiple apparatuses, so there is also need to synchronize the status between the apparatuses. Examples of these operations are shown in FIG. 5A-7. Generally, it may be beneficial to maintain the microphone status per apparatus, even if each apparatus may be engaged in several separate communication sessions. Then, if a user activates mute in the headset using a headset button, it may be assumed that the user desires to mute all coupled apparatuses at the same time. On the other hand, if user activates the mute function in a specific coupled apparatus, it may be understood that the desire is to mute only that apparatus, and not any other apparatuses coupled to the headset.

Figure 5A:
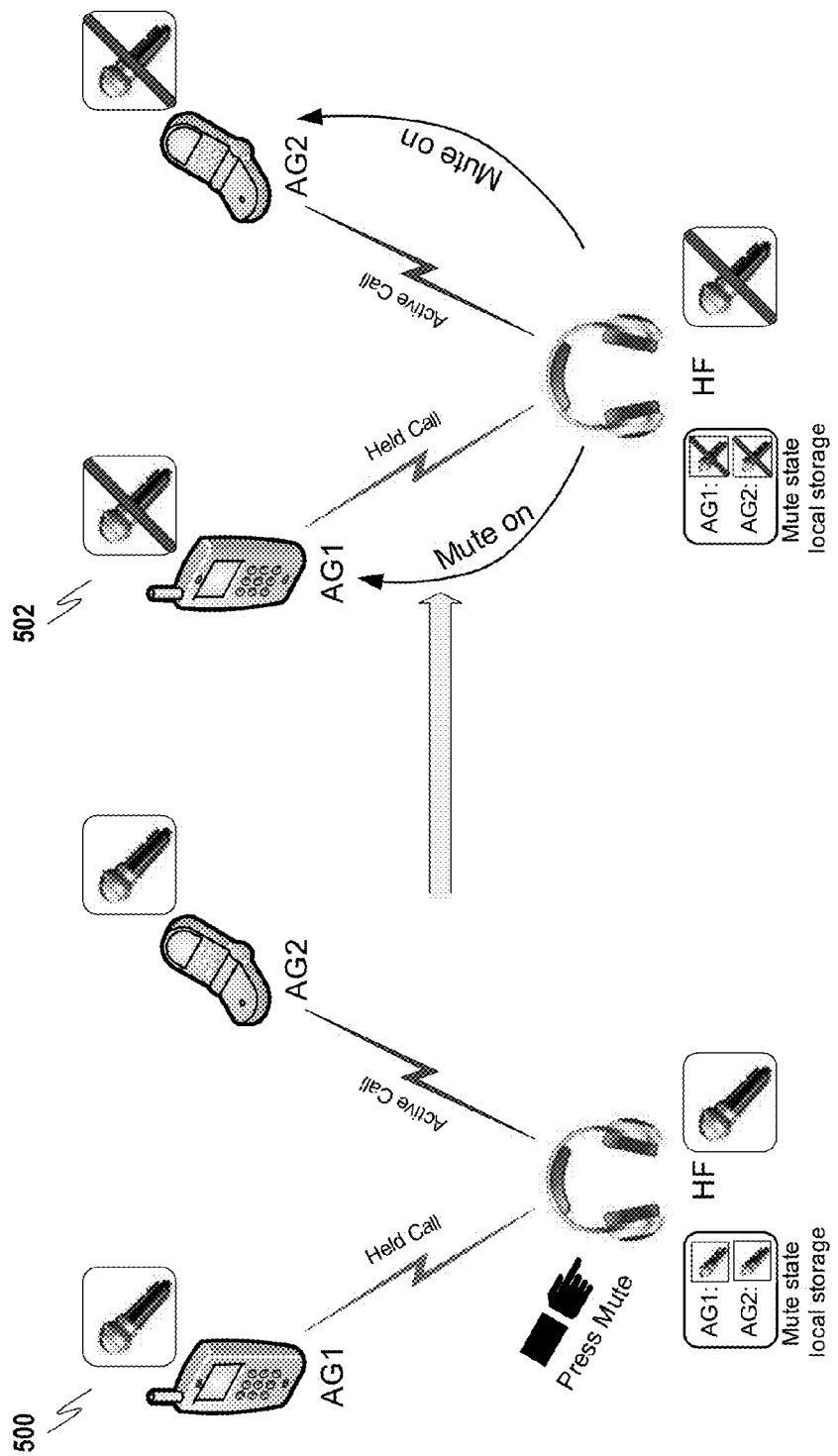
FIG. 5A discloses an example of the message between more than two apparatuses in accordance with at least one embodiment of the present invention.

In example 500 of FIG. 5A a headset (HF) may be coupled to two apparatuses (e.g., wireless communication devices) AG1 and AG2. Calls may be active in AG2 and held in AG1, respectively. The microphones in HF, AG1 and AG2 may all be active (unmuted). When a user activates the mute function (e.g., depresses a mute button) on the HF, the result may be as disclosed at 502. In particular, the microphones in HF, AG1 and AG2 may be muted, wherein AG1 and AG2 may be responding to a AT+VGM (VGM=0) that was transmitted from HF.

Figure 5B:
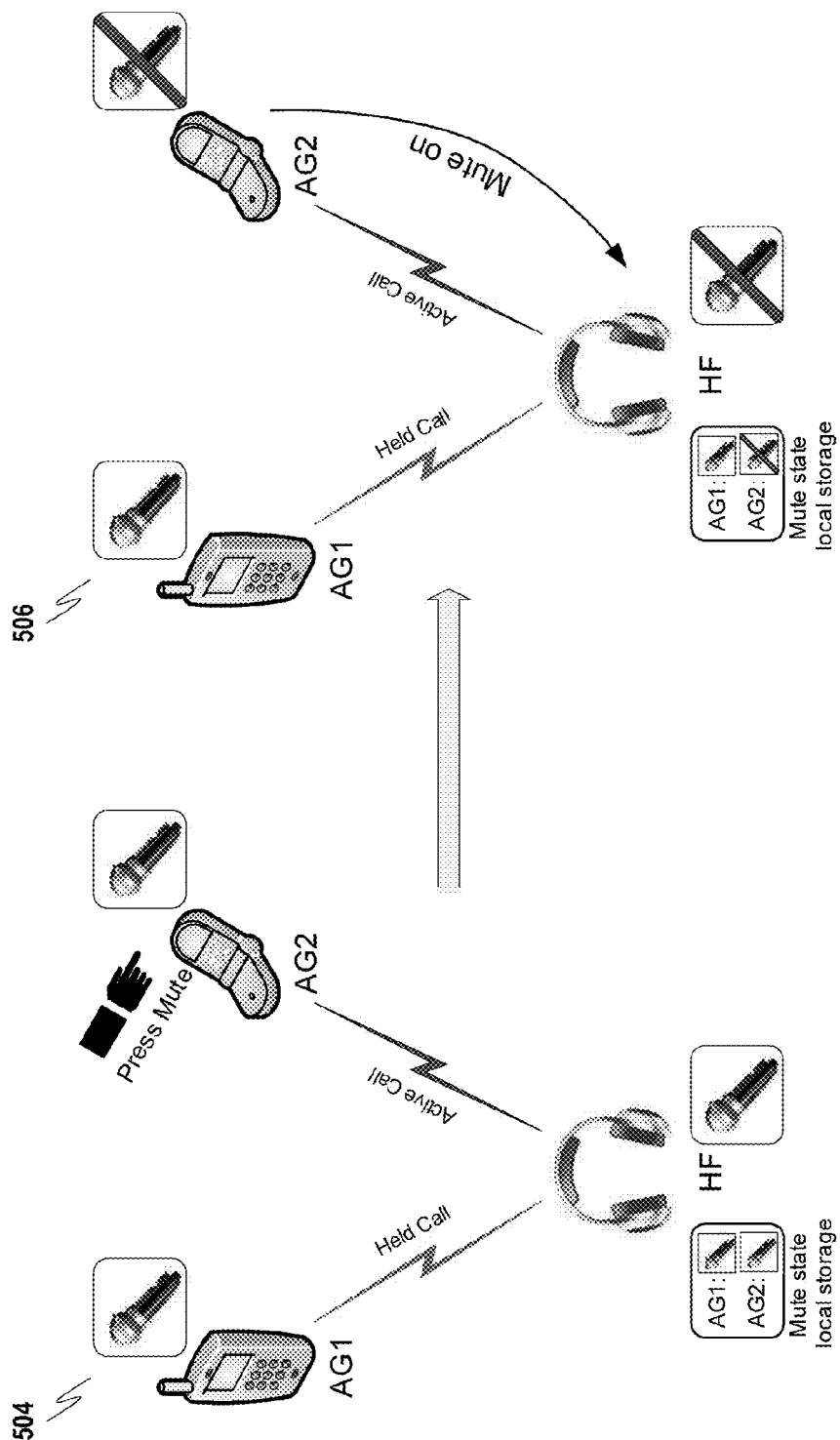
FIG. 5B discloses another example of the message between more than two apparatuses in accordance with at least one embodiment of the present invention.

FIG. 5B discloses another example of operation based on the scenario of FIG. 5A. A similar example is shown at 504 wherein AG1 has a held call, AG2 has an active call, and the microphones in all apparatuses are unmuted. In accordance with at least one embodiment of the present invention, when muting is activated in the AG2 apparatus a corresponding activation of the mute function may only occur in HF. In particular, the command transmitted from AG2 only affects HF. This result may occur, for example, due to coding in the command that identifies the source of the command and/or coding that identifies the intended destination of the command.

Figure 6A:
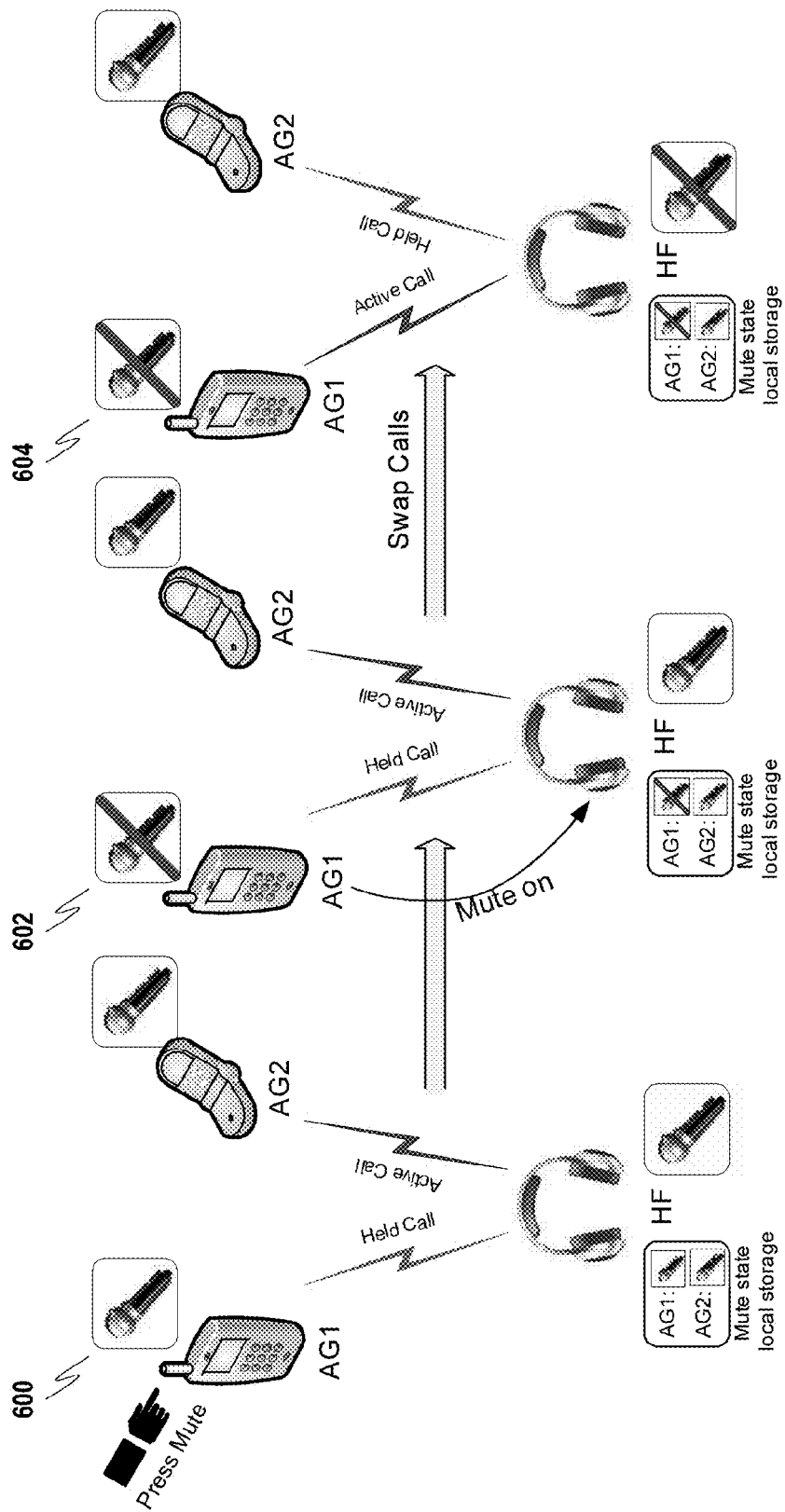
FIG. 6A discloses a third example of the message between more than two apparatuses in accordance with at least one embodiment of the present invention.

In accordance with at least one embodiment of the present invention, FIG. 6A discloses a similar introductory scenario to FIG. 5A but goes further to describe how microphone synchronization may operate when "swapping" from one active communication to another active communication in different apparatuses. At 600 the same introductory scenario is disclosed as in 5A, except that the mute function is being activated in AG1. As a result, at 602 HF may register that the microphone in AG1 is muted, but may not change the state of its own microphone since an active call is ongoing in AG2. However, when the calls are swapped (e.g., the active call in AG2 becomes held and the held call in AG1 becomes active) the microphone in HF may become muted, as shown at 604, in accordance with the previously recorded state of the microphone in AG1 (e.g., in accordance with the previous +VGM command that was received from AG1).

Figure 6B:
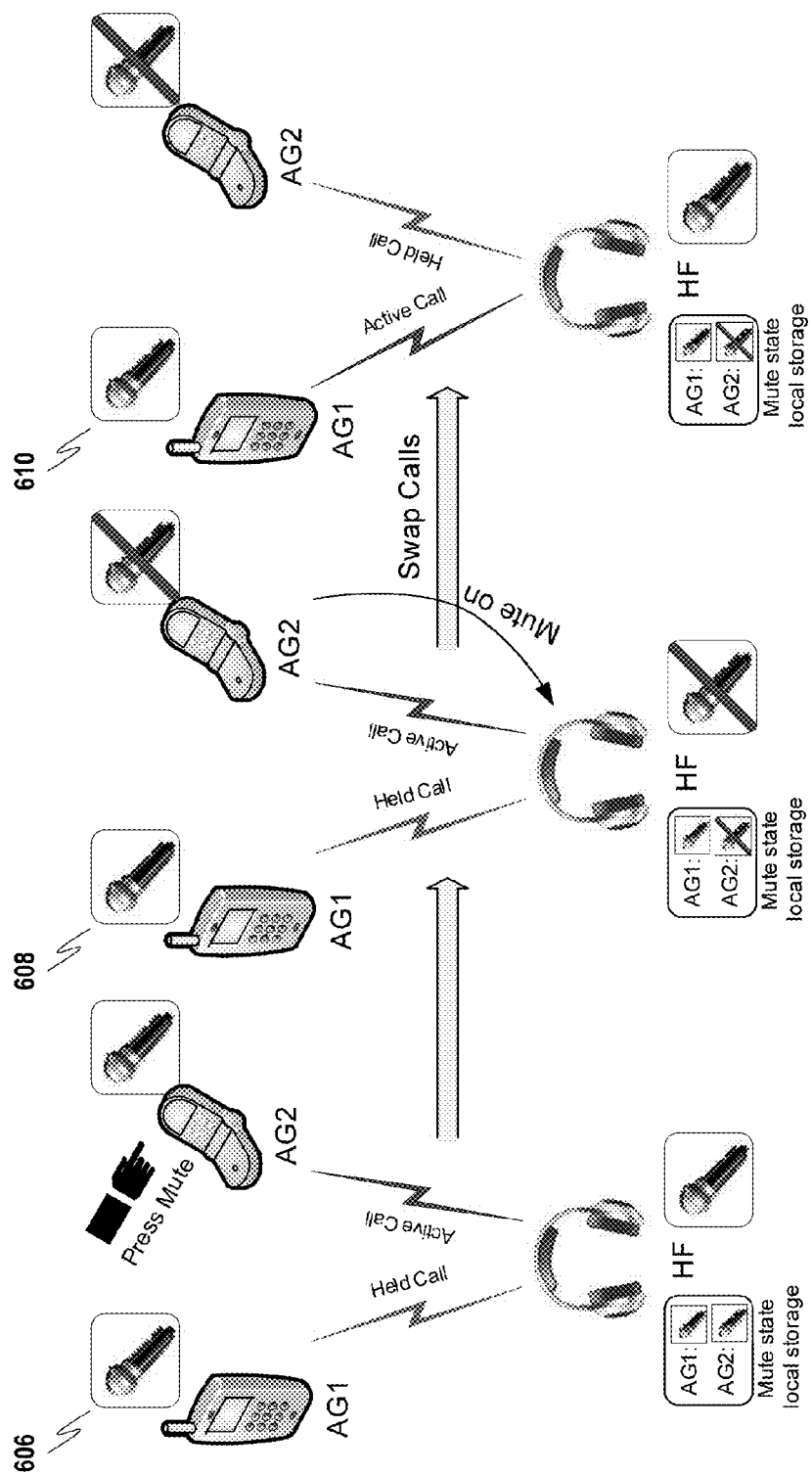
FIG. 6B discloses a fourth example of the message between more than two apparatuses in accordance with at least one embodiment of the present invention.

FIG. 6B shows an example situation going in the opposite direction of FIG. 6A. In particular, at 606 mute is activated in AG2, which has the active call. At 608 it is disclosed that HF may react accordingly (e.g., in response to receiving an +VGM command) and may set VGM to 0 on its own microphone. However, when the calls are swapped between AG1 and AG2 (e.g., the active call in AG2 becomes held and the held call in AG1 becomes active) the result at 610 shows that HF has unmuted its microphone in accordance with the last recorded state of AG1 (e.g., in accordance with the last +VGM message that was received from AG1).

FIG. 7 discloses an example interaction between HF, AG1 and AG2 when there is initially no active call in AG1. Initially, while AG1 may not be hosting an active call, HF and AG1 may still be coupled via wireless communication (e.g., Bluetooth). Muting be activated in HF at 700, which may in the example of 702 cause muting to be activated in AG2 (e.g., as a result of an AT+VGM command received at AG2). However, if AG1 later receives a call, and as a result, the active call on AG2 is held in order to attend to the incoming call on AG1, HF may unmute itself, as shown at 704. Thus may occur so that HF may synchronize its operation with the operation of AG1, the apparatus with the currently active communication (e.g., active call).

Figure 8:
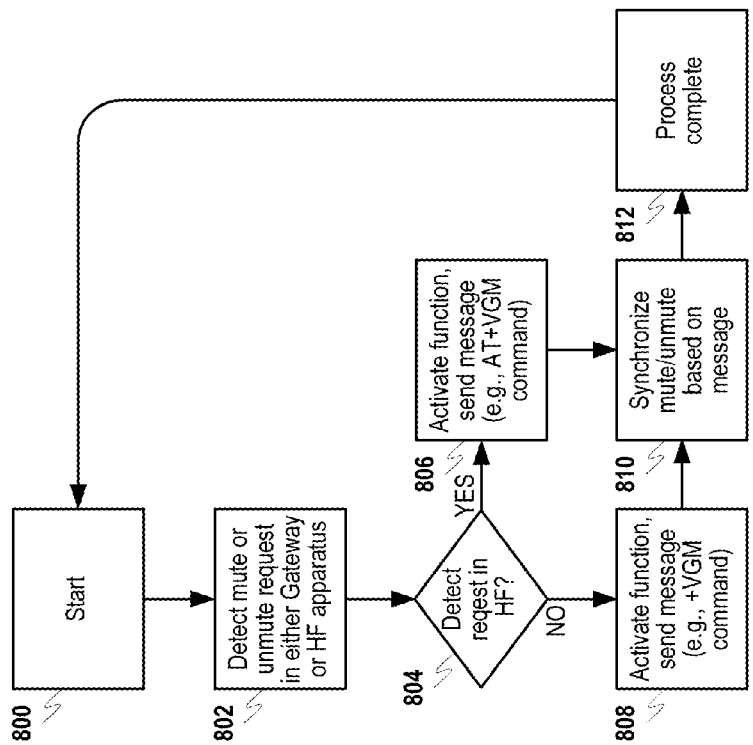
FIG. 8 discloses a flowchart for an second example communication control process in accordance with at least one example embodiment of the present invention.

A flowchart of an example process, in accordance with at least one embodiment of the present invention, is disclosed in FIG. 8. The process may initiate in step 800 and may then proceed to step 802 where a request to mute or unmute a microphone in either an Audio Gateway apparatus (e.g., a wireless communication device) or a Hands-Free (HF) apparatus (e.g., a headset) may be detected. Detecting a mute or unmute request may comprise detecting that a button on the apparatus that triggers activation of mute or unmute has been depressed. The process may then proceed to step 804 wherein a determination may be made as to whether mute or unmute was requested on the Audio Gateway or HF apparatus. If it is determined in step 804 that mute or unmute was requested at the HF apparatus, then in step 806 muting may be activated or deactivated (e.g., gain for the microphone in the HF apparatus may be set to zero for muting or a non-zero value for unmuting) and a message (e.g., command) may be transmitted from the HF apparatus indicating that muting has been activated or deactivated. For example, in the instance of Bluetooth wherein the Hands-Free profile 1.6 is being employed, activation of mute or unmute in the HF apparatus may trigger an AT+VGM command to be transmitted indicating that the HF apparatus has been muted (e.g., VGM=0) or unmuted (e.g., VGM=x, wherein x is a nonzero value). If in step 804 it is determined that mute or unmute was activated at the Audio Gateway apparatus, then in step 808 muting may activated or deactivated (e.g., gain may be set to zero for muting or to a nonzero value for unmuting) and a message (e.g., command) indicating mute or unmute may be transmitted from the Audio Gateway apparatus. For example, a +VGM command may be transmitted from the Audio Gateway apparatus, wherein VGM=0 may indicate muting or VGM=x may indicate unmuting, x being a nonzero value. In the instance of VGM=x, x may be a predefined value, a value configured in the apparatus by the apparatus user, etc.

Regardless of whether muting was activated/deactivated in the HF apparatus in step 806 or in the Audio Gateway apparatus in step 808, the process may then proceed to step 810 wherein the mute/unmute state of the apparatus that received the message (e.g., a +VGM or an AT+VGM command) may be synchronized to the mute/unmute state indicated in the received message. For example, in instances where the transmitting apparatus has been muted then VGM may also be set to 0 in the receiving apparatus. Alternatively, if the transmitting apparatus has been unmuted then VGM may be set to a value other than 0 in the receiving apparatus. The process may then be complete in step 810 and may reinitiate in step 800 in preparation for detection of next request to mute or unmute either the HF or Audio Gateway apparatuses.

Further to the above, the various example embodiments of the present invention are not strictly limited to the above implementations, and thus, other configurations are possible.

For example, an apparatus, in accordance with at least one embodiment of the present invention, may comprise means for determining if muting of a microphone has been requested, and means for, if it is determined that muting has been requested, activating muting and transmitting a message comprising information indicating that muting has been activated in the apparatus.

At least one other example embodiment of the present invention may include electronic signals that cause an apparatus to determine if muting of a microphone has been requested, and if it is determined that muting has been requested, activate muting and transmit a message comprising information indicating that muting has been activated in the apparatus.

Accordingly, it will be apparent to persons skilled in the relevant art that various changes in form a and detail can be made therein without departing from the spirit and scope of the invention. The breadth and scope of the present invention should not be limited by any of the above-described exemplary embodiments, but should be defined only in accordance with the following claims and their equivalents.

What is claimed:

1. A method, comprising:
   determining if muting of a microphone has been requested in an apparatus;
   if it is determined that muting has been requested, activating muting in the apparatus and transmitting a message from the apparatus, the message comprising information indicating that muting has been activated in the apparatus;
   determining if a message has been received in the apparatus, the received message comprising information indicating that muting has been activated or deactivated in another apparatus; and
   if it is determined that a message comprising information indicating that muting has been activated or deactivated in another apparatus has been received in the apparatus, activating or deactivating muting in the apparatus in accordance with the information in the received message.

2. The method of claim 1, wherein determining if muting of a microphone has been requested comprises determining if a mute button has been depressed in the apparatus.

3. The method of claim 1, wherein the information comprises an indication that gain for the microphone has been set to zero in the apparatus.

4. The method of claim 1, wherein transmitting a message from the apparatus comprises transmitting a message from the apparatus via Bluetooth wireless communication.

5. The method of claim 4, wherein, if the apparatus is a headset, the information comprises an AT+VGM command indicating that (VGM=0) in the apparatus; and
   if in the apparatus is a wireless communication device, the information comprises a +VGM command indicating that (VGM=0) in the apparatus.

6. The method of claim 1, further comprising determining if unmuting of the microphone has been requested in the apparatus;
   if it is determined that unmuting has been requested, deactivating muting in the apparatus and transmitting a message from the apparatus, the message comprising information indicating that muting has been deactivated in the apparatus.

7. A non-transitory computer readable storage medium having computer executable program code stored thereon, the computer executable program code comprising:
   code configured to cause an apparatus to determine if muting of a microphone has been requested;
   code configured to cause the apparatus to, if it is determined that muting has been requested, activate muting and transmit a message comprising information indicating that muting has been activated in the apparatus;
   code configured to cause the apparatus to determine if a message has been received, the received message comprising information indicating that muting has been activated or deactivated in another apparatus; and
   code configured to cause the apparatus to, if it is determined that a message comprising information indicating that muting has been activated or deactivated in another apparatus has been received, activate or deactivate muting in accordance with the information in the received message.

8. The non-transitory computer readable storage medium of claim 7, wherein the code configured to cause the apparatus to determine if muting of a microphone has been requested comprises code configured to cause the apparatus to determine if a mute button has been depressed.

9. The non-transitory computer readable storage medium of claim 7, wherein the information comprises an indication that gain for the microphone has been set to zero in the apparatus.

10. The non-transitory computer readable storage medium of claim 7, wherein the code configured to cause the apparatus to transmit a message comprises code configured to cause the apparatus to transmit a message via Bluetooth wireless communication.

11. The non-transitory computer readable storage medium of claim 10, wherein, if the apparatus is a headset, the information comprises an AT+VGM command indicating that (VGM=0) in the apparatus; and
   if in the apparatus is a wireless communication device, the information comprises a +VGM command indicating that (VGM=0) in the apparatus.

12. The non-transitory computer readable storage medium of claim 7, further comprising code configured to cause the apparatus to determine if unmuting of the microphone has been requested; and
   code configured to cause the apparatus to, if it is determined that unmuting has been requested, deactivate muting and transmitting a message comprising information indicating that muting has been deactivated in the apparatus.

13. An apparatus, comprising:
   at least one processor; and
   at least one memory including executable instructions, the at least one memory and the executable instructions being configured to, in cooperation with the at least one processor, cause the apparatus to perform at least the following:
   determine if muting of a microphone has been requested;
   if it is determined that muting has been requested, activate muting and transmit a message comprising information indicating that muting has been activated in the apparatus;
   determine if a message has been received, the received message comprising information indicating that muting has been activated or deactivated in another apparatus; and
   if it is determined that a message comprising information indicating that muting has been activated or deactivated in another apparatus has been received, activating or deactivating muting in accordance with the information in the received message.

14. The apparatus of claim 13, wherein the at least one memory and the executable instructions being configured to, in cooperation with the at least one processor, cause the apparatus to determine if muting of a microphone has been requested comprises the at least one memory and the executable instructions being configured to, in cooperation with the at least one processor, cause the apparatus to determine if a mute button has been depressed.

15. The apparatus of claim 13, wherein the information comprises an indication that gain for the microphone has been set to zero in the apparatus.

16. The apparatus of claim 13, wherein the at least one memory and the executable instructions being configured to, in cooperation with the at least one processor, cause the apparatus to transmit a message comprises the at least one memory and the executable instructions being configured to, in cooperation with the at least one processor, cause the apparatus to transmit a message via Bluetooth wireless communication.

17. The apparatus of claim 16, wherein, if the apparatus is a headset, the information comprises an AT+VGM command indicating that (VGM=0) in the apparatus; and if in the apparatus is a wireless communication device, the information comprises a +VGM command indicating that (VGM=0) in the apparatus.

18. The apparatus of claim 13, further comprising the at least one memory and the executable instructions being configured to, in cooperation with the at least one processor, cause the apparatus to determine if unmuting of the microphone has been requested; and if it is determined that unmuting has been requested, deactivate muting and transmit a message comprising information indicating that muting has been deactivated in the apparatus.

19. A system, comprising:
a first apparatus; and
a second apparatus;
the first apparatus determining if muting of a microphone has been requested, and if it is determined that muting has been requested, the first apparatus activating muting and transmitting a message to at least the second apparatus, the message comprising information indicating that muting has been activated in the first apparatus; and
the first apparatus determining if a message has been received, the received message comprising information indicating that muting has been activated or deactivated in the second apparatus, and if it is determined that a message comprising information indicating that muting has been activated or deactivated in second apparatus has been received, the first apparatus activating or deactivating muting in accordance with the information in the received message.

* * * * *